(12) United States Patent
Sultan

(10) Patent No.: US 6,475,885 B1
(45) Date of Patent: Nov. 5, 2002

(54) SOURCE/DRAIN FORMATION WITH SUB-AMORPHIZING IMPLANTATION

(75) Inventor: Akif Sultan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/896,490

(22) Filed: Jun. 29, 2001

(51) Int. Cl.[7] .............................................. H01L 21/425
(52) U.S. Cl. ....................... 438/514; 438/301; 438/305; 257/344
(58) Field of Search ................................. 438/514, 301, 438/305; 257/344

(56) References Cited

U.S. PATENT DOCUMENTS

| | | | |
|---|---|---|---|
| H986 H | * 11/1991 | Codella et al. | 437/41 |
| 5,858,864 A | * 1/1999 | Aronowitz et al. | 438/528 |
| 5,970,353 A | * 10/1999 | Sultan | 438/302 |
| 6,008,099 A | * 12/1999 | Sultan et al. | 438/305 |
| 6,180,470 B1 | * 1/2001 | Aronowitz et al. | 438/301 |
| 6,274,450 B1 | * 8/2001 | Lin et al. | 438/305 |
| 6,344,405 B1 | * 2/2002 | Saha | 438/514 |

FOREIGN PATENT DOCUMENTS

EP            0 806 794 A2  *  12/1997  .........  H01L/21/265

OTHER PUBLICATIONS

Stanley Wolf and Richard N. Tauber; *Silicon Processing for the VLSI Era, vol. 1—Process Technology;* pp. 297–308; 1986 (Month Unknown).

* cited by examiner

Primary Examiner—David Nelms
Assistant Examiner—Tu-Tu Ho
(74) Attorney, Agent, or Firm—Timothy M. Honeycutt

(57) ABSTRACT

Various methods of fabricating a source/drain structure are provided. In one aspect, a method of processing a semiconductor workpiece is provided that includes implanting a neutral ion species into the substrate at a sub-amorphizing dosage to provide a plurality of interstitials and forming a source/drain region in the substrate by implanting impurities of a first conductivity type proximate the plurality of interstitials. The plurality of interstitials retards diffusion of the impurities. Impurity diffusion is retarded, resulting in better activation and a more abrupt impurity profile.

22 Claims, 5 Drawing Sheets

SOURCE/DRAIN FORMATION WITH SUB-AMORPHIZING IMPLANTATION

BACKGROUND OF THE INVENTION

1. Field of the Invention

This invention relates generally to semiconductor processing, and more particularly to methods of fabricating source/drain structures.

2. Description of the Related Art

A typical field effect transistor consists of a gate electrode positioned on a semiconductor substrate and a gate dielectric layer interposed between the gate electrode and the substrate. Source/drain impurity regions are formed in the substrate on either side of the gate electrode. The lateral separation between the source/drain regions defines the channel region for the transistor. Changes in the electric field emitted from the gate electrode alter the conductivity of the substrate in the channel region and thereby turn the transistor on or off.

Many types of field effect transistors are fabricated with source/drain regions that include lightly doped drain ("LDD") or source/drain extension region structures. The LDD structures extend beneath the gate electrode to reduce hot carrier effects through a reduction in the peak electric field. While helping to eliminate hot carrier effects, LDD regions nevertheless increase the parasitic resistance of the transistor by providing a high resistance path between the source and the drain.

The conventional fabrication of a source/drain region involves the introduction of conductivity altering impurities into the substrate, normally by ion implantation, followed by an activation anneal. The anneal is designed to disperse the implanted impurities as well as repair crystalline damage inflicted on the substrate by the implantation process. A pre-amorphization technique is frequently used to improve the activation of the source/drain regions and therefore improve the performance of the transistor. A typical pre-amorphization process involves implanting the substrate in the vicinity of the source/drain regions with a neutral species, such as silicon or germanium. The dosage of the implant is set high enough to ensure amorphization. During the subsequent activation anneal, the silicon within the amorphous region regrows into a generally defect free region with good activation. However, the conventional pre-amorphization approach is not without drawbacks. The end-of-range damage is frequently not completely removed during the anneal since the thermal budget for small geometry devices is quite low. Thus, the activation anneal may not be performed for a long enough duration in order to remove the end-of-range damage. The unannealed damage beyond the amorphous/crystalline interface increases the diode junction leakage, which may be undesirable for some applications.

The present invention is directed to overcoming or reducing the effects of one or more of the foregoing disadvantages.

SUMMARY OF THE INVENTION

In accordance with one aspect of the present invention, a method of processing a semiconductor workpiece is provided that includes implanting a neutral ion species into the substrate at a sub-amorphizing dosage to provide a plurality of interstitials. A source/drain region is formed in the substrate by implanting impurities of a first conductivity type proximate the plurality of interstitials. The plurality of interstitials retards diffusion of the impurities.

In accordance with another aspect of the present invention, a method of processing is provided that includes implanting a neutral ion species into a silicon-on-insulator substrate at a sub-amorphizing dosage to provide a plurality of interstitials. A source/drain region is formed in the silicon-on-insulator substrate by implanting impurities of a first conductivity type proximate the plurality of interstitials. The plurality of interstitials retards diffusion of the impurities.

In accordance with another aspect of the present invention, a method of forming a source/drain extension region in a semiconductor substrate is provided that includes implanting a neutral ion species into the substrate at a sub-amorphizing dosage to provide a plurality of interstitials and implanting impurities of a first conductivity type proximate the plurality of interstitials. The substrate is annealed to activate the implanted impurities. The plurality of interstitials retards diffusion of the implanted impurities.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
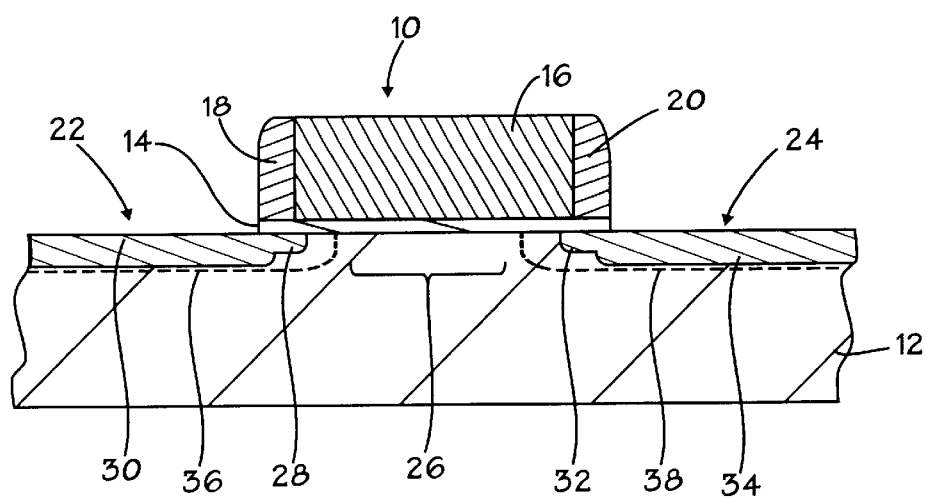
FIG. 1 is a cross-sectional view of an exemplary embodiment of an integrated circuit transistor fabricated in accordance with the present invention.

In the drawings described below, reference numerals are generally repeated where identical elements appear in more than one figure. Turning now to the drawings, and in particular to FIG. 1, therein is shown a cross-sectional view of an exemplary embodiment of an integrated circuit transistor 10 fabricated on a semiconductor workpiece or substrate 12 in accordance with the present invention. The substrate or workpiece 12 may be composed of silicon, germanium, silicon-on-insulator or other suitable substrate materials. The transistor 10 includes a gate dielectric layer 14 formed on the substrate 12 and a gate electrode 16 formed on the gate dielectric layer 14. The gate electrode 16 is bracketed by a pair of insulating sidewall spacers 18 and 20. Source/drain regions 22 and 24 are formed in the substrate 12 with a lateral separation that generally defines a channel region 26 in the substrate 12. The phrase "source/drain region(s)" is used herein to describe a region that may serve as either a source or a drain. The skilled artisan will appreciate that a source/drain region may function as a source or a drain depending upon how it is interconnected with subsequent metallization. The source/drain regions 22 and 24 are formed from impurities of a conductivity type, e.g., n-type or p-type that is opposite to the conductivity type of the background substrate 12.

The source/drain region 22 consists of a source/drain extension region 28 and an overlapping doped region 30. The source/drain region 24 similarly consists of a source/drain extension region 32 and an overlapping doped region 34. Halo regions 36 and 38 are provided in the substrate proximate the source/drain regions 22 and 24 respectively. The halo regions 36 and 38 have a conductivity type that is opposite to that of the source/drain regions 22 and 24. The halo regions 36 and 38 provide a measure of protection against lateral punch-through.

Figure 2:
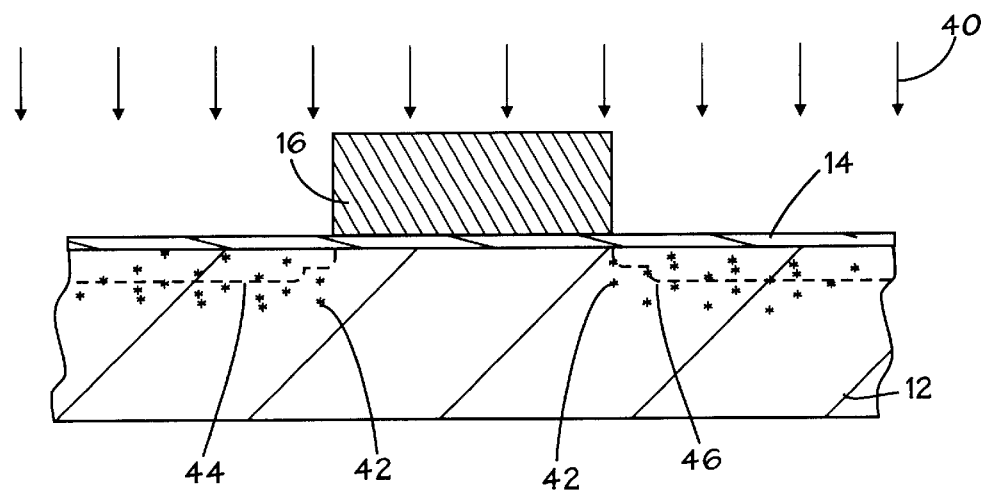
FIG. 2 is a cross-sectional view of an exemplary semiconductor substrate depicting a gate electrode/gate dielectric layer stack on a semiconductor substrate and a sub-amorphizing implant in accordance with the present invention.

An exemplary method for fabricating the source/drain extension regions 28 and 32 and the associated components of the transistor 10 may be understood by referring now to FIGS. 2, 3, 4, 5, 6 and 7 and initially to FIG. 2. The method will be described in the context of a n-channel field effect transistor. However, the skilled artisan will appreciate that the techniques may be applied to other types of devices as desired. The gate dielectric layer 14 may be initially fabricated on the substrate 12 using a variety of well-known gate dielectric materials, such as, for example, oxide, silicon nitride, various metal oxides such as $Ta_2O_5$, laminates of these or the like, and fabricated using well-known thermal oxidation or chemical vapor deposition techniques. In an exemplary embodiment, the gate dielectric layer 14 is an oxide film formed by thermal oxidation with a thickness of about 25 to 100 Å.

The gate electrode 16 may be formed on the gate dielectric layer 14 by depositing and lithographically patterning a layer 16 of conducting material. The layer 16 may be composed of a variety of conducting materials, such as, for example, polysilicon, amorphous silicon, aluminum, tantalum or the like. In an exemplary embodiment, the layer 16 is polysilicon. Well-known techniques for applying polysilicon, such as chemical vapor deposition ("CVD"), may be used to deposit the layer 16. In an exemplary embodiment, the polysilicon is deposited in-situ after the layer 14 at or above about 625° C. to a thickness of about 750 to 1800 Å, and advantageously to about 1300 Å. The polysilicon may be rendered conductive by in-situ doping or by later implants for the source/drain regions 22 and 24 (see FIG. 1).

Subsequent to the conductor deposition, well-known masking and anisotropic etching techniques may be used to pattern the gate electrode 16 into the desired shape. The lateral dimension of the gate electrode 16 may or may not be the minimum feature size for the prevailing lithographic technology.

A goal of the process of the present invention is to provide for fabrication of a source/drain region with a relatively abrupt doping profile without resort to amorphization of the substrate 12 and the attendant difficulties associated with damage at an amorphous/crystalline interface noted above. Accordingly, an implant of a neutral species 40 is performed. The term "neutral" is intended to mean particles that do not substantially affect the conductivity characteristics of the substrate 12. Exemplary materials include, for example, silicon, germanium or the like. The dosage of the implant is selected to be sub-amorphizing, that is, not high enough to produce an amorphization of the substrate 12. In this way, a plurality of interstitials 42 are established in the substrate 12 in the vicinity of the anticipated implant profiles of the source/drain regions 22 and 24 as indicated by the dashed lines 44 and 46. The interstitials 42 will consist largely of particles of the substrate 12 displaced by collisions with the bombarding neutral species ions 40. As an example, a process involving implantation of germanium ions into a silicon substrate will yield a plurality of interstitials 42 consisting largely of silicon atoms displaced from the silicon lattice. The converse would be true where the substrate 12 is composed of germanium and the implanted neutral species 40 is silicon. Note that silicon and germanium represent a few possibilities.

The maximum critical dosage, $D_{crit}$, for the sub-amorphizing implant may be determined in a variety of ways. For example, the following equation may be used to obtain a reasonably good estimate of the critical sub-amorphizing dosage:

$$Dcritical=[(10^{21}\ keV/cm^3)R_p]/E_0$$

where $E_0$ is the implant energy and $R_p$ is the projected range of the neutral species 40. Optionally, the critical dosage may be determined empirically through experimentation and/or manufacturing experience. For example, one rule of thumb applicable for silicon substrates is a critical dosage of about 2E15 ons/cm².

The implant of the neutral species 40 creates a plurality of interstitials 42 between about Rp and 2Rp where Rp is the projected range of the neutral species 40. The projected range Rp is proportional to the implant energy of the neutral species 40. The energy of the neutral species 40 should be chosen such that the plurality of interstitials 42 is placed just below the source/drain extension regions 28 and 32. The energy of the neutral species 40 is thus dependent on the energy and dose for the source/drain extension regions 28 and 32. In an exemplary embodiment, the sub-amorphizing implant of the neutral ions 40 may be performed at room temperature with a dose of about 5E13 to 8E14 ions/cm² and an energy of about 30 to 120 keV. The aforementioned energy translates into a projected range $R_p$ of about 250 to 1000 Å. The implant angle may be 0°, 7° or higher tilts as desired and any appropriate twist may be applied.

The implant of the neutral ions 40 may be performed with the gate dielectric layer 14 extending laterally from the edges of the gate electrode 16 as shown. Optionally, the layer 14 may be etched back to the substrate 12 prior to the implant as desired. In either case, the gate electrode 16 acts as a hard mask against the implant leaving the region of the substrate 12 immediately beneath the gate electrode 16 relatively unblemished by the implant.

Figure 3:
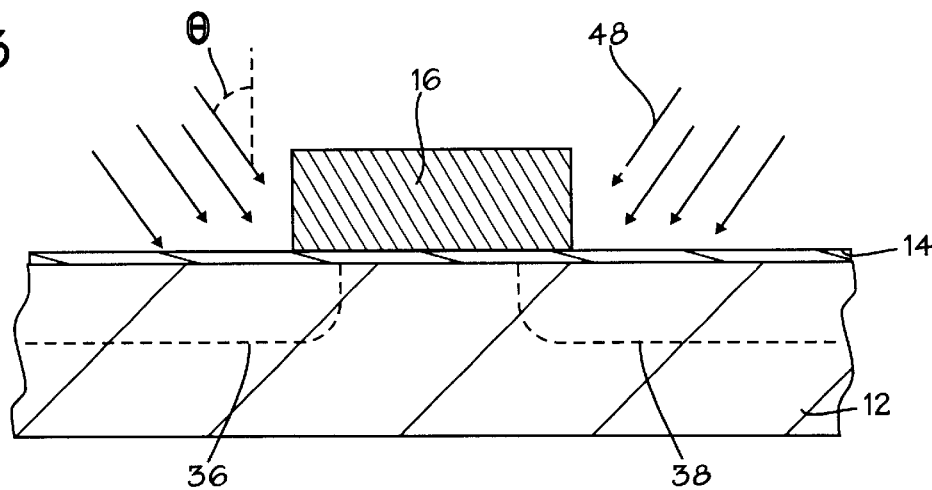
FIG. 3 is a cross-sectional view like FIG. 2 depicting formation of halo regions in the substrate in accordance with the present invention.

Referring now to FIG. 3, the halo regions 36 and 38 may be established by tilted ion implant. Impurity ions 48 are implanted into the substrate 12 at an angle θ that may be, for example, about 10 to 45°. If the source/drain regions 22 and 24 shown in FIG. 1 will be implemented as n-type, then a suitable p-type impurity, such as boron, $BF_2$, or indium may be implanted. In an exemplary embodiment, boron may be implanted at an energy of about 5 to 15 keV and a dosage of about 3E13 to 4E13 ions/cm$^2$. If desired, a dual halo scheme may be employed wherein successive implants are performed. The first implant may be performed at a relatively shallow angle of about 10 to 150 and the second implant may be performed at a relatively steeper angle of about 20 to 45° to provide for greater lateral penetration beneath the gate electrode 16.

Figure 4:
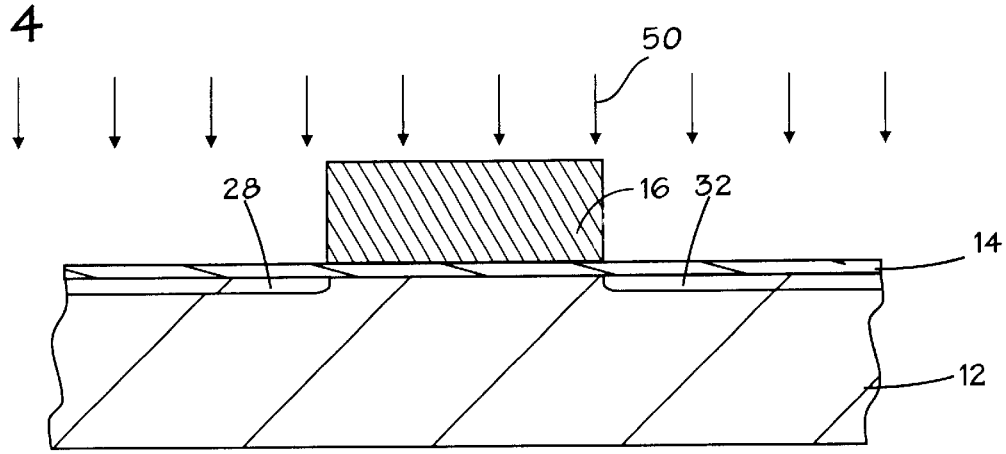
FIG. 4 is a cross-sectional view like FIG. 3 depicting formation of source/drain extension regions in the substrate in accordance with the present invention.

Referring now to FIG. 4, the source/drain extension regions 28 and 32 may be formed in the substrate 12 by implantation of impurity ions 50. If the source/drain extension regions 28 and 32 will be implemented as n-type, then a suitable n-type impurity such as, for example, phosphorous, arsenic or the like may be implanted. Relatively shallow junctions are more favorable for very small geometry devices. In an exemplary embodiment, arsenic may be implanted at an energy of about 3 to 15 keV and a dosage of about 6E14 to 2E15 ions/cm$^2$. The implant may be at 0 or 7° as desired. Again, the dielectric layer 14 may be left in place as an implant screen and the gate electrode 16 acts as a hard mask against the implant. Note that the initial lateral edges of the source/drain extension regions 28 and 32 are substantially self-aligned with the edges of the gate electrode 16.

Figure 5:
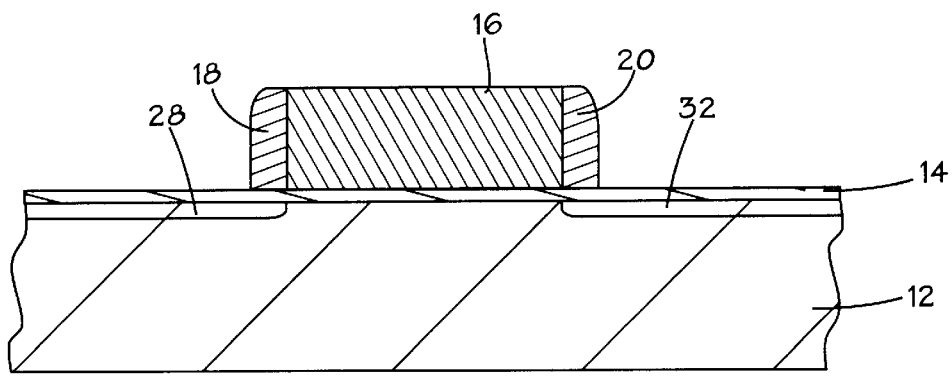
FIG. 5 is a cross-sectional view like FIG. 4 depicting fabrication of dielectric sidewall spacers adjacent to the gate electrode in accordance with the present invention.
Figure 6:
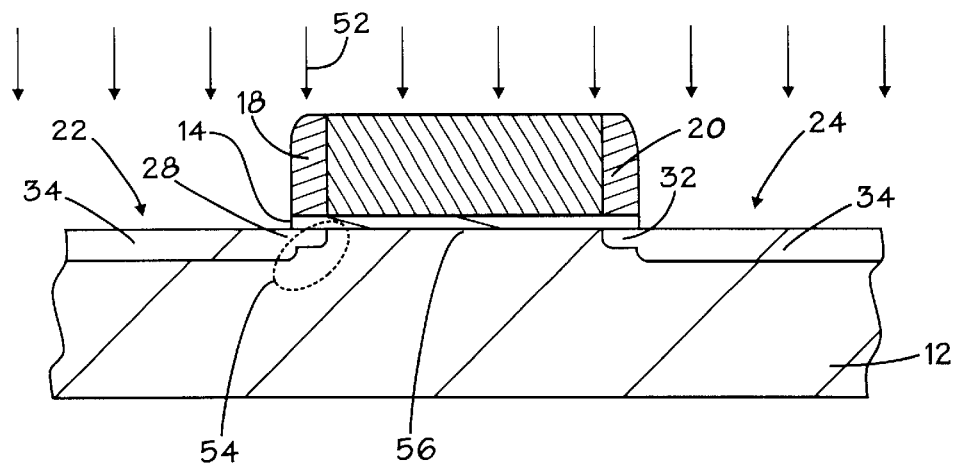
FIG. 6 is a cross-sectional view like FIG. 5 depicting formation of overlapping impurity regions for the source/drain regions in accordance with the present invention.
Figure 7:
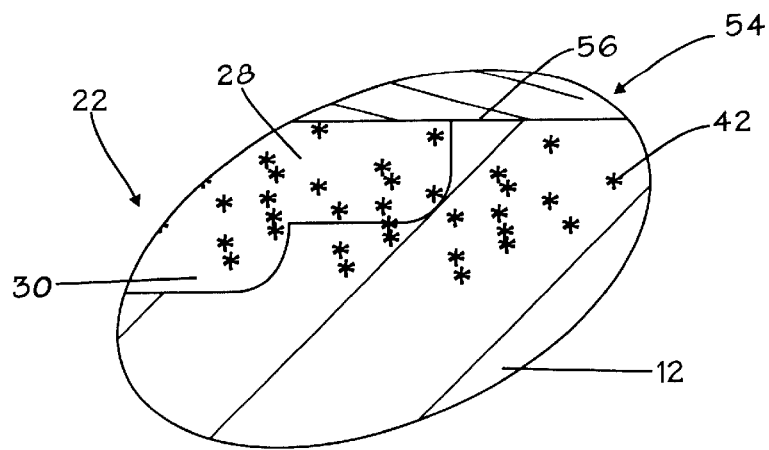
FIG. 7 is a magnified cross-sectional view of a selected portion of FIG. 6 showing the interstitials in accordance with the present invention.

Referring now to FIG. 5, the spacers 18 and 20 may be fabricated using well-known dielectric spacer formation techniques such as, for example, thermal oxidation, CVD, or the like. If CVD is selected, a conformal layer of dielectric material is initially deposited on the substrate 12 and over the gate electrode 16. The conformal dielectric layer may be composed of a variety of materials commonly used for dielectric spacers, such as silicon nitride, silicon dioxide, silicon oxynitride, or the like. In an exemplary embodiment, the layer is composed of silicon dioxide deposited by CVD to a thickness of about 20 to 100 Å and advantageously to about 60 Å. Following deposition, the layer is anisotropically etched to yield the spacers 18 and 20. The etch may be by reactive ion etching, chemical plasma etching, or other suitable anisotropic etching techniques utilizing a chemistry suitable for anisotropically etching silicon nitride, such as $CF_4/O_2$.

With the spacers 18 and 20 in place, a second implant of impurity ions 52 may be performed to establish the overlapping impurity regions 30 and 34 of the source/drain regions 22 and 24. In an exemplary embodiment, arsenic may be implanted at an energy of about 20 to 80 keV and a dosage of about 2E15 to 8E15 ions/cm$^2$. The implant may be at 0 or 70 as desired.

An anneal is performed to activate the source/drain regions 22 and 24. The activity of the interstitials introduced via the aforementioned sub-amorphizing implant may be understood by referring now to FIG. 6, and to FIG. 7, which is a magnified cross-sectional view of the portion of FIG. 6 circumscribed generally by the dashed oval 54. During the activation anneal, the plurality of interstitials 42 provides an interstitial flux that moves toward the silicon-dielectric interface 56. This interstitial flux retards the diffusion of the impurities making up the source/drain extension region 28, resulting in a more abrupt dopant profile with better activation than would be possible using conventional techniques. In an exemplary embodiment, the anneal may be carried out at about 950 to 1050° C. for about 5 to 20 seconds in a rapid thermal processing chamber.

Figure 8:
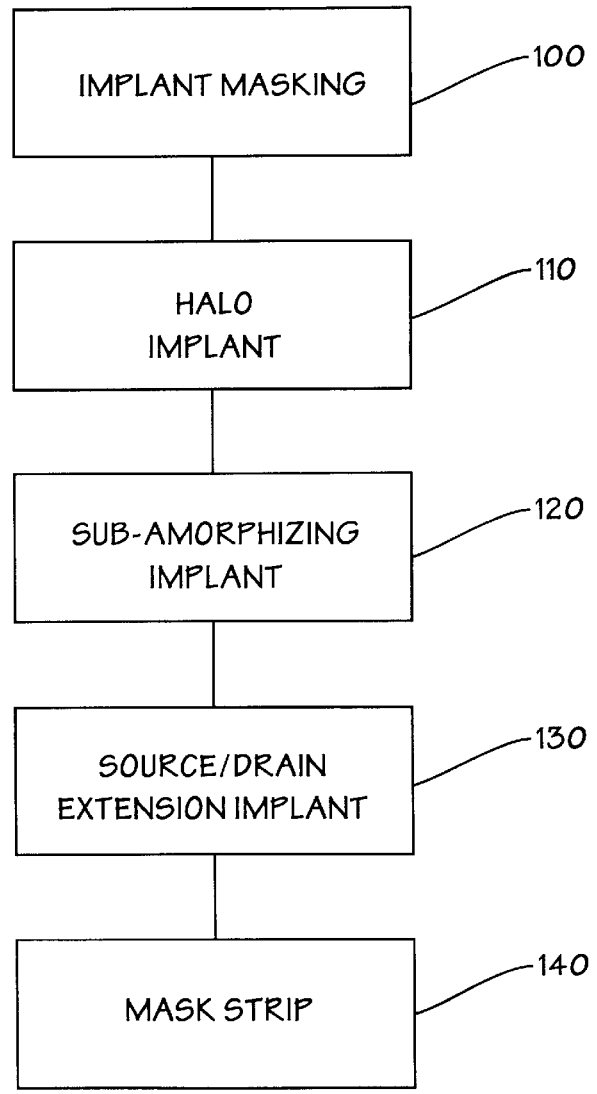
FIG. 8 is a flow chart depicting one exemplary embodiment of the process of the present invention.

In the foregoing illustrative embodiment, the sub-amorphizing implant of interstitials precedes halo and source/drain extension implant steps. However, the skilled artisan will appreciate that numerous variations are contemplated in accordance with the present invention. For example, FIG. 8 depicts an alternate exemplary process flow in which implant masking 100 is followed by halo implantation 110, sub-amorphizing implantation 120 and source/drain extension implantation 130. Mask stripping 140 may follow thereafter. The implant masking 100 may be provided in circumstances where complimentary devices will be patterned on the same substrate, e.g., n-channel and p-channel transistors or other types of n-channel or p-channel devices, as is common in CMOS processing. In this circumstance, p-channel devices may be masked during the implantation steps for the complimentary n-channel devices. The mask stripping 140 may be performed using well-known ashing and/or solvent stripping techniques. Similarly, the implant masking step 100 may utilize well-known photoresist lithography techniques.

Figure 9:
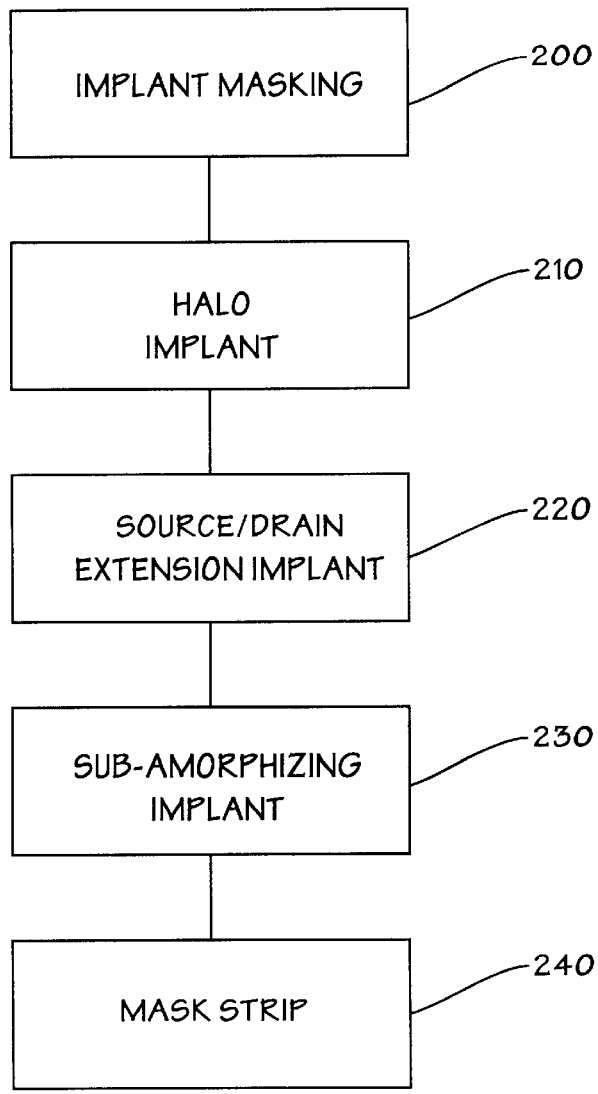
FIG. 9 is a flow chart depicting an alternate exemplary embodiment of the process of the present invention.

Another alternate exemplary embodiment in accordance with the present invention may be understood by referring now to FIG. 9. In this illustrative embodiment, implant masking 200, halo implantation 210, and source/drain extension implantation 220 precede a sub-amorphizing implant 230. As with the other illustrative embodiment, mask stripping 240 may follow the sub-amorphizing implant 230. In both the embodiments depicted in FIGS. 8 and 9, a source/drain implant may be performed to provide an overlapping region 30 or 34 of the type depicted in FIG. 1 and an activation anneal is performed as described above.

Figure 10:
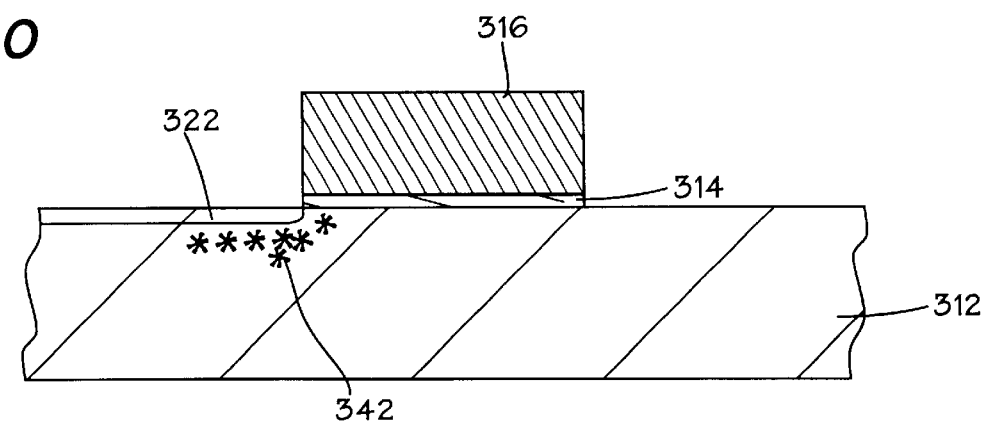
FIG. 10 is a cross-sectional view like FIG. 4 but depicting an alternate exemplary process flow involving a single-graded source/drain region in accordance with the present invention.

In the foregoing illustrative embodiments, the source/drain regions 22 and 24 are implemented as multi-graded or dual graded source/drain regions, that is, with a source/drain extension region and an overlapping impurity region. However, the skilled artisan will appreciate that the benefits of the present invention may be realized in a single-graded source/drain region. FIG. 10 depicts an illustrative embodiment of a source/drain region 322 that is implemented as a single-graded source/drain region. The source/drain region 322 may be provided in the substrate 12 by ion implantation self-aligned to the gate electrode 16 and the gate dielectric layer 14 as generally described above, albeit with a single implant. The plurality of interstitials 42 may be provided in the substrate 12 as generally described above in any of the foregoing illustrative embodiments to again retard the diffusion of the lateral tip 325 of the source/drain region 322.

Figure 11:
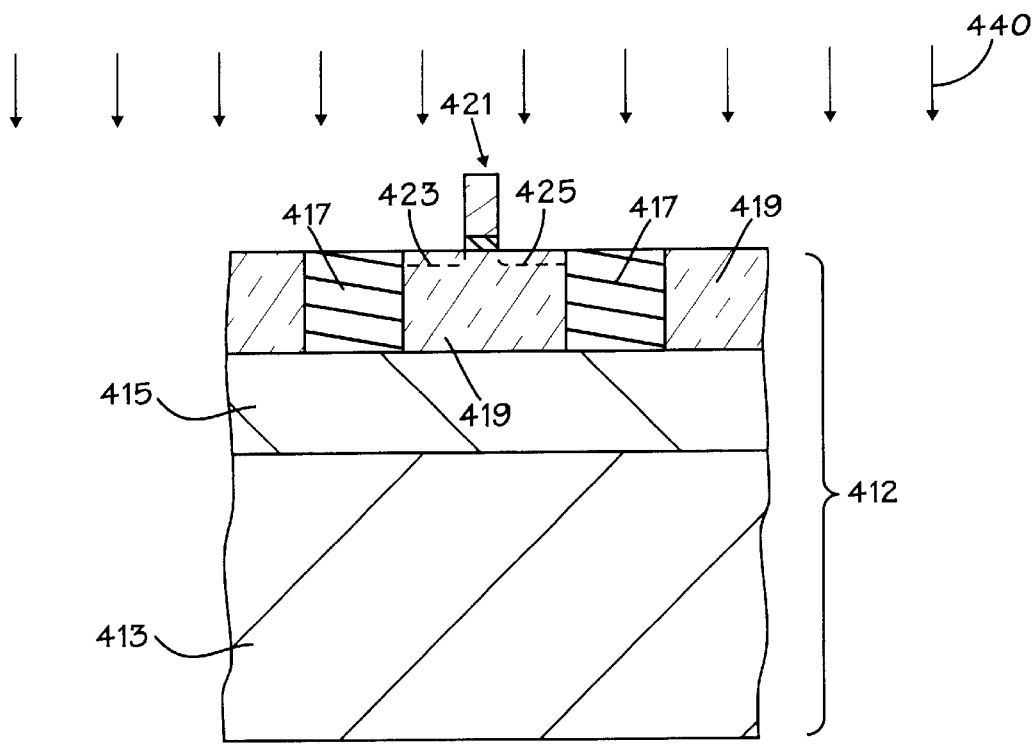
FIG. 11 is a cross-sectional view of an exemplary silicon-on-insulator substrate undergoing processing in accordance with an embodiment of the present invention.

An exemplary embodiment applicable to a silicon-insulator substrate may be understood by referring now to FIG. 11. A cross-sectional view of a silicon-on-insulator substrate 412 is illustrated. The silicon-on-insulator substrate 412 includes a base semiconductor substrate 413, an insulating layer 415 and an insulating layer 417. The insulating layers 415 and 417 circumscribe and define semiconductor islands or active regions 419. The semiconductor layers 413 and 419 may be silicon, germanium or the like. The insulating layers 415 and 417 may be oxide, sapphire or other well-known insulating materials.

Devices, such as a gate electrode stack 421, are implemented on the islands 419. The desired positions of later-formed source/drain structures are represented by the dashed lines 423 and 425. A sub-amorphizing implant of neutral ions 440 may be performed as generally described above to enhance source/drain activation and impurity profile.

Figure 12:
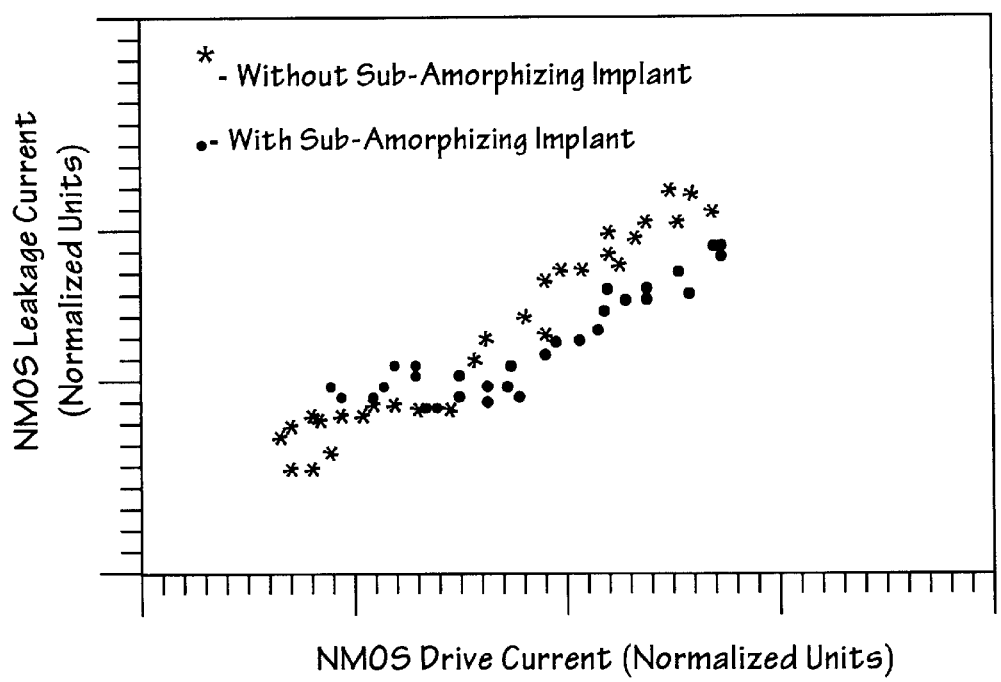
FIG. 12 depicts plots of leakage current versus drive current for a transistor device with and without the sub-amorphizing implant of the present invention.

Plots, in normalized units, of NMOS leakage current versus NMOS drive current with and without a sub-amorphizing implant are illustrated in FIG. 12. The plots are generated from measurements performed on a silicon substrate with a boron-implanted halo region and an arsenic-implanted source/drain extension region. Silicon was selected as the neutral sub-amorphizing implant species. Note that with the sub-amorphizing implant, lower leakage currents are provided without sacrificing drive current and/or higher drive currents are provided at a relatively constant leakage current.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of processing a semiconductor workpiece, comprising:

implanting a neutral ion species into the substrate at a sub-amorphizing dosage to provide a plurality of interstitials; and forming a source/drain region in the substrate by implanting impurities of a first conductivity type proximate the plurality of interstitials, the plurality of interstitials retarding diffusion of the impurities.

2. The method of claim 1, wherein the neutral ion species comprises silicon.

3. The method of claim 1, wherein the neutral ion species comprises germanium.

4. The method of claim 1, wherein the forming of the source/drain region comprises forming a source/drain extension region.

5. The method of claim 1, comprising forming a gate dielectric layer and a gate electrode on the substrate.

6. The method of claim 5, comprising forming a pair of insulating spacers adjacent to the gate electrode.

7. The method of claim 1, comprising forming a halo region around the source/drain region.

8. The method of claim 1, wherein the forming of the source/drain region comprises annealing the substrate to activate the source/drain region.

9. A method of processing, comprising:

implanting a neutral ion species into a silicon-on-insulator substrate at a sub-amorphizing dosage to provide a plurality of interstitials; and forming a source/drain region in the silicon-on-insulator substrate by implanting impurities of a first conductivity type proximate the plurality of interstitials, the plurality of interstitials retarding diffusion of the impurities.

10. The method of claim 9, wherein the neutral ion species comprises silicon.

11. The method of claim 9, wherein the neutral ion species comprises germanium.

12. The method of claim 9, wherein the forming of the source/drain region comprises forming a source/drain extension region.

13. The method of claim 9, comprising forming a gate dielectric layer and a gate electrode on the silicon-on-insulator substrate.

14. The method of claim 13, comprising forming a pair of insulating spacers adjacent to the gate electrode.

15. The method of claim 9, comprising forming a halo region around the source/drain region.

16. The method of claim 9, wherein the forming of the source/drain region comprises annealing the silicon-on-insulator substrate to activate the source/drain region.

17. A method of forming a source/drain extension region in a semiconductor substrate, comprising:

implanting a neutral ion species into the substrate at a sub-amorphizing dosage to provide a plurality of interstitials; and implanting impurities of a first conductivity type proximate the plurality of interstitials; and annealing the substrate to activate the implanted impurities, the plurality of interstitials retarding diffusion of the implanted impurities.

18. The method of claim 17, wherein the neutral ion species comprises silicon.

19. The method of claim 17, wherein the neutral ion species comprises germanium.

20. The method of claim 17, comprising forming a gate dielectric layer and a gate electrode on the substrate, the implantation of the impurities being self-aligned to the gate electrode.

21. The method of claim 20, comprising forming a pair of insulating spacers adjacent to the gate electrode.

22. The method of claim 17, comprising forming a halo region around the source/drain extension region.

* * * * *